(12) United States Patent
Barth, Jr. et al.

(10) Patent No.: US 9,059,322 B2
(45) Date of Patent: Jun. 16, 2015

(54) SEMICONDUCTOR-ON-INSULATOR (SOI) DEEP TRENCH CAPACITOR

(71) Applicant: International Business Machines Corporation, Armonk, NY (US)

(72) Inventors: John E. Barth, Jr., Williston, VT (US);
Herbert L. Ho, New Windsor, NY (US);
Babar A. Khan, Ossining, NY (US);
Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 13/625,286

(22) Filed: Sep. 24, 2012

(65) Prior Publication Data

US 2014/0084411 A1    Mar. 27, 2014

(51) Int. Cl.
*H01L 27/108*    (2006.01)
*H01L 21/84*    (2006.01)
*H01L 29/94*    (2006.01)
*H01L 27/12*    (2006.01)
*H01L 49/02*    (2006.01)

(52) U.S. Cl.
CPC .............. *H01L 21/84* (2013.01); *H01L 29/945* (2013.01); *H01L 27/1203* (2013.01); *H01L 28/60* (2013.01); *H01L 28/91* (2013.01)

(58) Field of Classification Search
CPC ........................ H01L 27/108; H01L 27/10897
See application file for complete search history.

(56) References Cited

U.S. PATENT DOCUMENTS

| | | | |
|---|---|---|---|
| 6,225,029 B1 * | 5/2001 | Bongaerts et al. | 430/313 |
| 6,429,070 B1 * | 8/2002 | Gonzalez et al. | 438/253 |
| 6,479,852 B1 * | 11/2002 | Wu | 257/301 |
| 7,098,105 B2 * | 8/2006 | Juengling | 438/257 |
| 7,713,814 B2 | 5/2010 | Cheng et al. | |
| 7,728,371 B2 | 6/2010 | Cheng et al. | |
| 7,888,723 B2 | 2/2011 | Brodsky et al. | |
| 7,989,865 B2 | 8/2011 | Barth, Jr. et al. | |
| 8,012,796 B2 | 9/2011 | Andry et al. | |
| 8,835,250 B2 * | 9/2014 | Faltermeier et al. | 438/248 |
| 8,835,274 B2 * | 9/2014 | Hu | 438/396 |
| 8,928,057 B2 * | 1/2015 | Cote et al. | 257/301 |
| 2005/0202672 A1 * | 9/2005 | Divakaruni et al. | 438/652 |
| 2008/0283891 A1 | 11/2008 | Lee et al. | |
| 2010/0200949 A1 | 8/2010 | Booth, Jr. et al. | |
| 2010/0230735 A1 | 9/2010 | Zhu | |
| 2012/0064694 A1 | 3/2012 | Booth, Jr. et al. | |
| 2013/0005102 A1 * | 1/2013 | Juengling | 438/270 |

* cited by examiner

*Primary Examiner* — Matthew W Such
*Assistant Examiner* — Ali Naraghi
(74) *Attorney, Agent, or Firm* — Michael J. LeStrange; Hoffman Warnick LLC (57) ABSTRACT

Aspects of the present invention relate to a semiconductor-on-insulator (SOI) deep trench capacitor. One embodiment includes a method of forming a deep trench capacitor structure. The method includes: providing a SOI structure including a first and second trench opening in a semiconductor layer of the SOI structure, forming a doped semiconductor layer covering the semiconductor layer, forming a first dielectric layer covering the doped semiconductor layer, forming a node metal layer over the first dielectric layer, forming a second dielectric layer covering the node metal layer, filling a remaining portion of each trench opening with a metal layer to form an inner node in each of the trench openings, the metal layer including a plate coupling each of the inner nodes, and forming a node connection structure to conductively connect the node metal layer in the first trench opening with the node metal layer in the second trench opening.

20 Claims, 13 Drawing Sheets

SEMICONDUCTOR-ON-INSULATOR (SOI) DEEP TRENCH CAPACITOR

BACKGROUND

1. Technical Field

The subject matter disclosed herein relates generally to semiconductor structures. More specifically, the subject matter disclosed herein relates to a semiconductor-on-insulator (SOI) deep trench capacitor.

2. Related Art

Deep trench (DT) capacitors can be used as memory elements in semiconductor structures. More specifically, embedded dynamic random access memory (DRAM) devices may utilize deep trenches as memory elements. However, as semiconductor technology improves and DRAM devices continue to become smaller in size, fabrication of (DT) capacitors become more difficult. In order to properly fabricate these DT semiconductor structures, the fabrication process must be very precise, which can result in additional fabrication time of the semiconductor.

BRIEF SUMMARY

A semiconductor-on-insulator (SOI) deep trench capacitor and method of forming is disclosed. One embodiment includes a method of forming a deep trench capacitor structure. The method includes: providing a semiconductor-on-insulator (SOI) structure including a first trench opening and a second trench opening in a semiconductor layer of the SOI structure; forming a doped semiconductor layer covering sidewalls and exposing a bottom surface of each of the first and the second trench openings; forming a first node dielectric layer covering the doped semiconductor layer; forming a node metal layer over the first node dielectric layer and contacting the bottom surface of each of the first and the second trench openings; forming a second node dielectric layer covering the node metal layer; filling a remaining portion of each trench opening with a metal layer to form an inner node in each of the first and the second trench openings, the metal layer including a plate coupling the inner node of each of the first and the second trench openings; and forming a node connection structure to conductively connect the node metal layer in the first trench opening with the node metal layer in the second trench opening.

A first aspect of the invention includes a method of forming a deep trench capacitor structure. The method includes: providing a semiconductor-on-insulator (SOI) structure including a first trench opening and a second trench opening in a semiconductor layer of the SOI structure; forming a doped semiconductor layer covering sidewalls and exposing a bottom surface of each of the first and the second trench openings; forming a first node dielectric layer covering the doped semiconductor layer; forming a node metal layer over the first node dielectric layer and contacting the bottom surface of each of the first and the second trench openings; forming a second node dielectric layer covering the node metal layer; filling a remaining portion of each trench opening with a metal layer to form an inner node in each of the first and the second trench openings, the metal layer including a plate coupling the inner node of each of the first and the second trench openings; and forming a node connection structure to conductively connect the node metal layer in the first trench opening with the node metal layer in the second trench opening.

A second aspect of the invention includes a deep trench capacitor having: a semiconductor-on-insulator (SOI) structure including a first trench opening and a second trench opening in a semiconductor layer of the SOI structure; a doped semiconductor layer covering sidewalls and exposing a bottom surface of each of the first and the second trench openings; a first node dielectric layer covering the doped semiconductor layer; a node metal layer over the first node dielectric layer, the node metal layer contacting the bottom surface of each of the first and the second trench openings; a second node dielectric layer covering the node metal layer; a metal layer disposed within a remaining portion of the first and the second trench openings to form an inner node, the metal layer including a plate coupling the inner node of each of the first and the second trench openings; and a node connection structure conductively connecting the node metal layer in the first trench opening with the node metal layer in the second trench opening.

A third aspect of the invention includes a method of forming a deep trench capacitor structure. The method including: providing a semiconductor-on-insulator (SOI) structure including a plurality of trench openings in a semiconductor layer of the SOI structure; forming a doped semiconductor layer covering sidewalls and exposing a bottom surface of each of the plurality of trench openings; forming a first node dielectric layer covering the doped semiconductor layer; forming an outer node metal layer over the first node dielectric layer and contacting the bottom surface of each of the plurality of trench openings; forming a second node dielectric layer covering the outer node metal layer; filling a remaining portion of each of the plurality of trench openings with an inner node metal layer, the inner node metal layer including a plate coupling the inner node metal layer filled in each of the plurality of trench openings; and forming a node connection structure to conductively connect the outer node metal layer in a first trench opening of the plurality of trench openings with the outer node metal layer in a second trench opening of the plurality of trench openings.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, aspects of the invention relate to a semiconductor structure. Specifically, as described herein, aspects of the invention relate to a semiconductor-on-insulator (SOI) deep trench capacitor.

Figure 1:
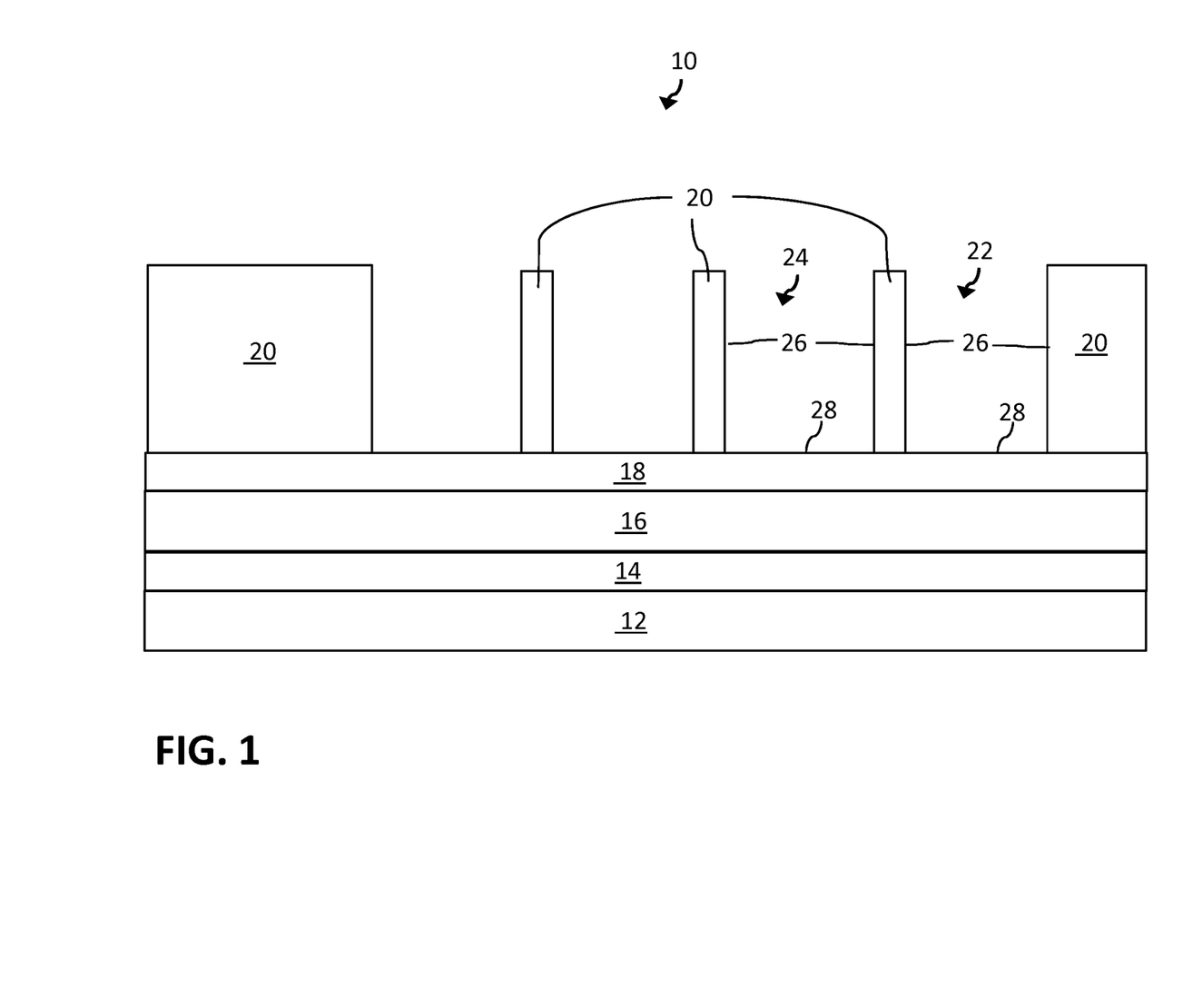
FIGS. 1-9 depict cross-sectional views of a semiconductor-on-insulator (SOI) deep trench capacitor structure undergoing processes according to various embodiments of the invention.

Turning to FIG. 1, a side cross-sectional view of a semiconductor-on-insulator (SOI) structure 10 is shown according to embodiments of the invention. More specifically, SOI structure 10, may include a first handle wafer 12, a first dielectric layer 14 (e.g., an oxide) formed over first handle wafer 12, an active layer 16 formed over first dielectric layer 14, a second dielectric layer 18 over active layer 16, and a semiconductor layer 20 formed over second dielectric layer 18. In an embodiment, active layer 16 may include a monocrystalline silicon. However, other semiconductor materials may also be used in forming active layer 16. Semiconductor layer 20 may include silicon, and more specifically, semiconductor layer 20 may include a high resistance polysilicon. In an alternative embodiment, semiconductor layer 20 may include, but is not limited to germanium, silicon germanium, silicon carbide, and those consisting essentially of one or more III-V compound semiconductors having a composition defined by the formula $AlX1GaX2InX3AsY1PY2NY3SbY4$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $ZnA1CdA2SeB1TeB2$, where A1, A2, B1, and B2 are relative proportions each greater than or equal to zero and $A1+A2+B1+B2=1$ (1 being a total mole quantity).

In an embodiment, as shown, in FIG. 1, first handle wafer 12, first dielectric layer 14, active later 16, second dielectric layer 18 and semiconductor layer 20 may be formed using any now known or later developed process. For example, each layer may be formed by any conventional depositing process (e.g., chemical vapor deposition) and may be planed by any now known or later developed process (e.g., chemical mechanical polish) for providing a contact surface for bonding to an additional layer. In addition, each layer (e.g., first handle wafer 12, first dielectric layer 14, etc.) may be bonded to another respective layer by any now known or later developed bonding technique.

In an embodiment, as shown in FIG. 1, SOI structure 10 may also include a first trench opening 22 and a second trench opening 24 in semiconductor layer 20 of SOI structure 10. First and second trench openings 22, 24 may be formed in semiconductor layer 20 by an etching process performed on semiconductor layer 20. As shown in FIG. 1, first and second trench openings 22, 24 provide sidewalls 26 within the trench openings and expose a bottom surface 28 of second dielectric layer 18 positioned within first and second trench openings 22, 24. As also shown in FIG. 1, SOI structure 10 may also include additional trench openings, distinct from first and second trench openings 22, 24.

Figure 2:
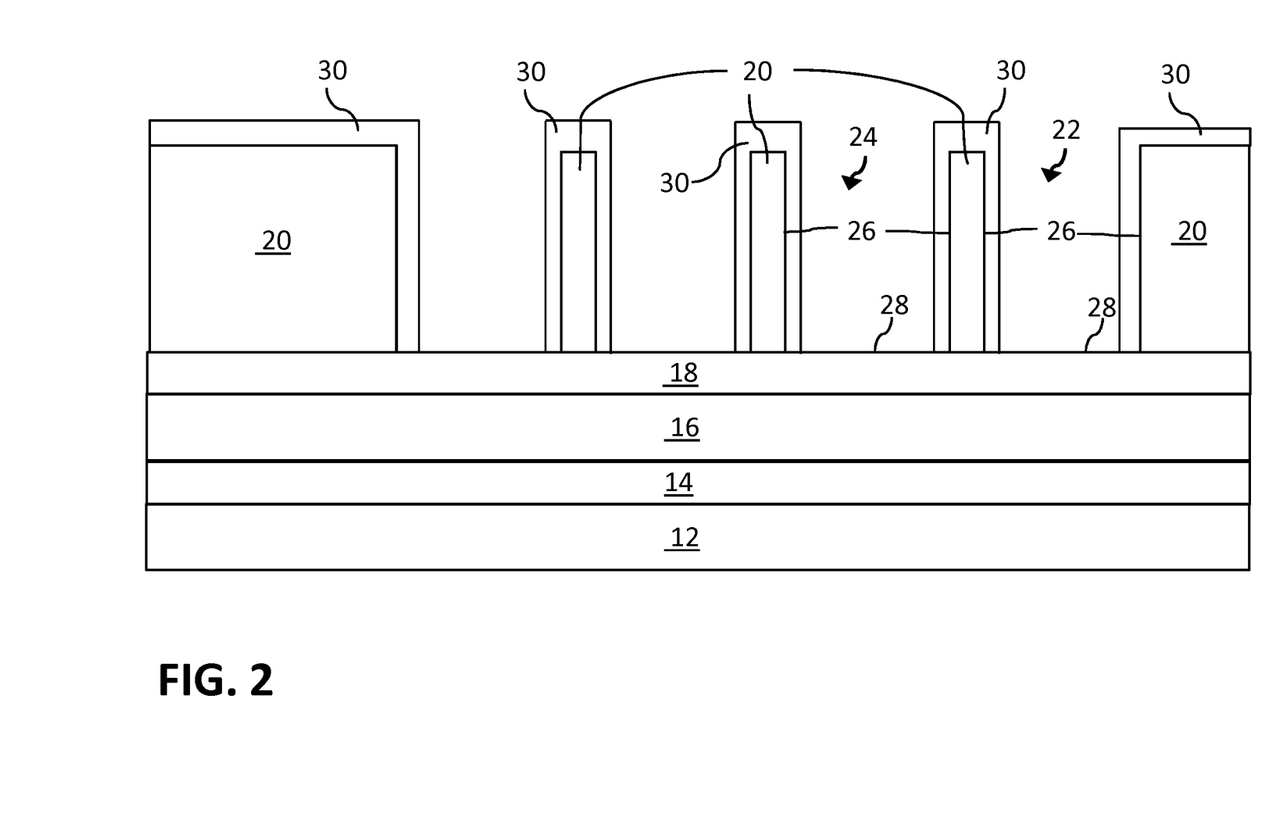

FIG. 2 depicts another process according to various embodiments of the invention, the process including forming a doped semiconductor layer 30 covering sidewalls 26 and exposing bottom surface 28 of each of the first and second trench openings 22, 24. More specifically, doped semiconductor layer 30 may cover the exposed surfaces of semiconductor layer 20 of SOI structure 10. In an embodiment, as shown in FIG. 2, doped semiconductor layer 30 may include a doped silicon, and more specifically, semiconductor layer 30 may include a low resistance doped silicon. Semiconductor layer 30 may be doped by any conventional technique. For example, semiconductor layer 30 may be doped using N-type dopants, which may include but are not limited to: phosphorous (P), arsenic (As), antimony (Sb). N-type indicates an element is introduced to semiconductor layer 30 to generate free electrons (by "donating" electron to semiconductor); must have one more valance electron than semiconductor; common donors in silicon (Si): phosphorous (P), arsenic (As), antimony (Sb) and in gallium arsenic (GaAs): sulphur (S), selenium (Se), tin (Sn), silicon (Si), and carbon (C). Doped semiconductor layer 30 may be formed over semiconductor layer 20 using any conventional deposition techniques now known or later developed. For example, deposition techniques or the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
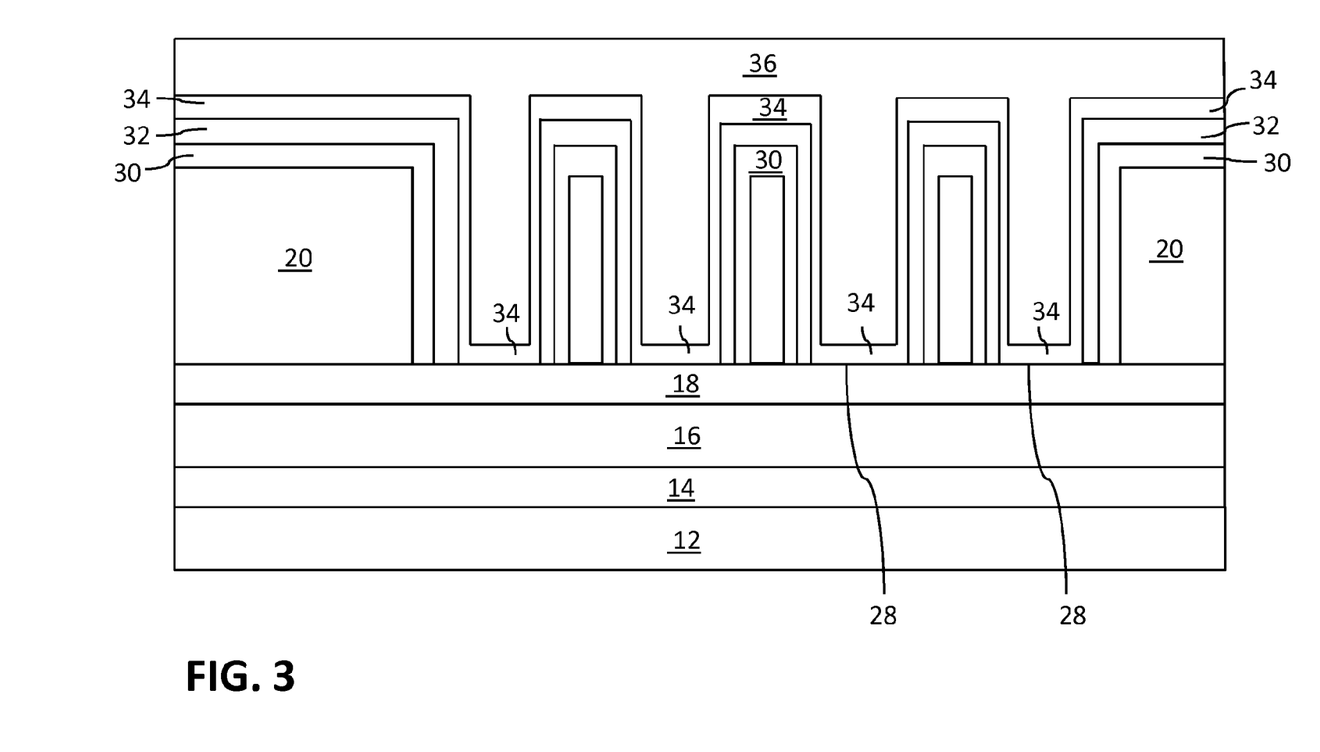

FIG. 3 depicts another process according to various embodiments of the invention, the process including forming a first node dielectric layer 32 covering the doped semiconductor layer 30. Forming first node dielectric layer 32 may include depositing a dielectric (e.g., oxide) over a surface of doped semiconductor layer 30. In an embodiment, as shown in FIG. 3, first node dielectric layer 32 may only cover a portion of exposed bottom 28 of second dielectric layer 18 of SOI structure 10. More specifically, dielectric layer 32 may be deposited over doped semiconductor layer 30 and exposed bottom 28 of second dielectric layer 18, and then may be etched to remove a portion of dielectric layer 32 deposited over exposed bottom 28 of second dielectric layer 18. This process may be performed to isolate doped semiconductor layer 30 from material that may be located within first and second trench openings 22, 24.

FIG. 3 also depicts another process according to various embodiments of the invention, the process including forming a node metal layer 34 over first node dielectric 32 and contacting bottom surface 28 of each of first and second trench openings 22, 24 therewith. More specifically, node metal layer 34 may be formed as an outer node metal layer with respect to first and second trench openings 22, 24. Node metal layer 34 may include, for example, titanium nitride (TiN), tungsten (W), or tungsten silicide ($WSi_2$). Additionally, node metal layer 34 may be formed according to one or more of the various deposition techniques now known or later developed. More specifically, node metal layer 34 may be formed over first node dielectric 32 and bottom surface 28 by chemical vapor deposition (CVD). Also shown in FIG. 3 is a sacrificial material 36 formed over node metal layer 34. Sacrificial material 36 may include resist, amorphous carbon, polysilicon or any other conventional material that may be easily removed from node metal layer 34. Sacrificial material 36 may be formed over node metal layer 34 according to one or more of the various deposition techniques now known or later developed.

Figure 4:
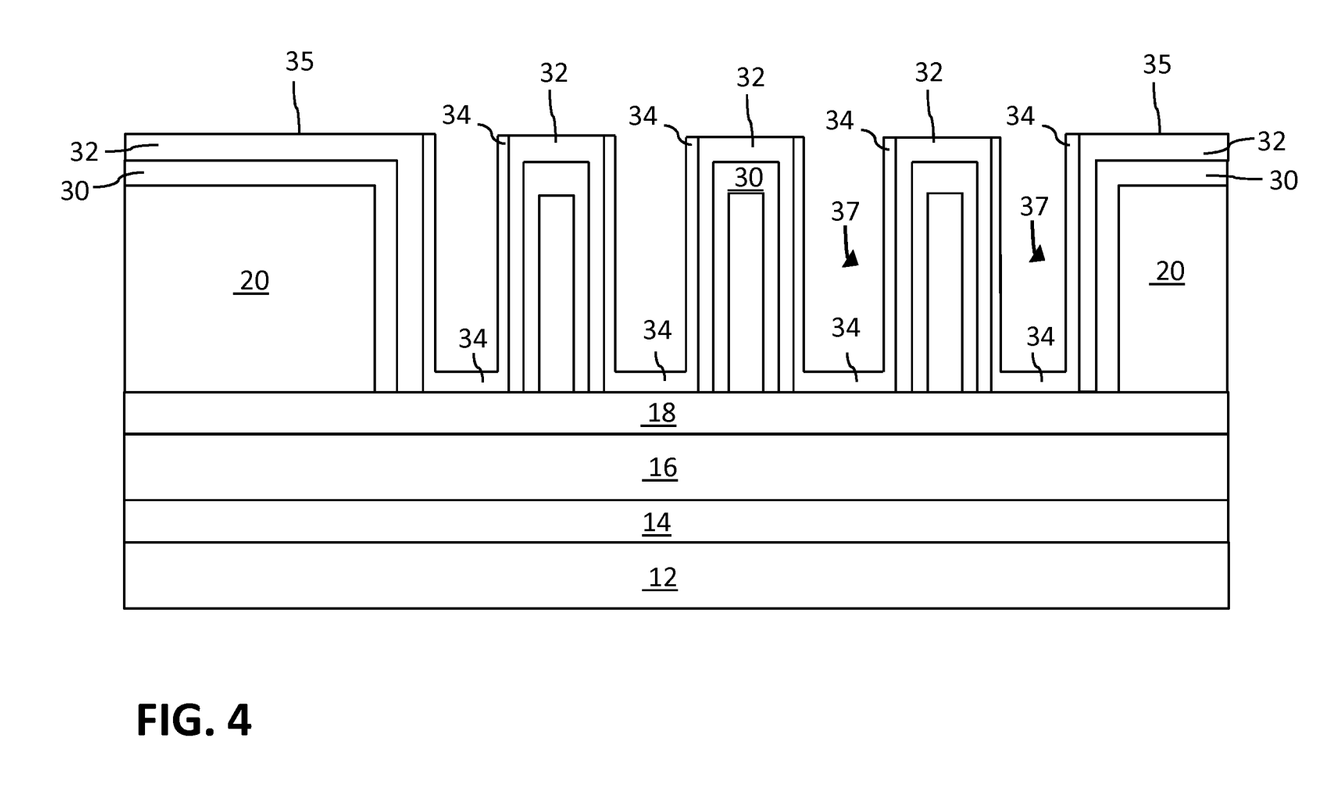

FIG. 4 depicts another process according to various embodiments of the invention, the process including removing sacrificial material 36 formed over node metal layer 34. In an embodiment, as shown in FIG. 4, sacrificial material 36 may be completely recessed from covering node metal layer 34 by various material removal techniques now known or later developed, e.g., CMP, polishing, reactive ion etch (RIE), etc. Additionally, as shown in FIG. 4, a portion of node metal layer 34 over first node dielectric layer 32 may be removed. More specifically, a portion of node metal layer 34 over the horizontal surface 35 of first node dielectric layer 32 over doped semiconductor layer 30 may be removed by a material removal process, e.g., CMP, RIE, etc. The process of removing or etching a portion of node metal layer 34 over first node dielectric layer 32 may result in node metal layer 34 forming a substantially U-shaped node 37 within each of first and second trench openings 22, 24. Additionally, the removal of a portion of node metal layer 34 over first node dielectric layer 32 may expose horizontal surface 35 of first node dielectric layer 32.

Figure 5:
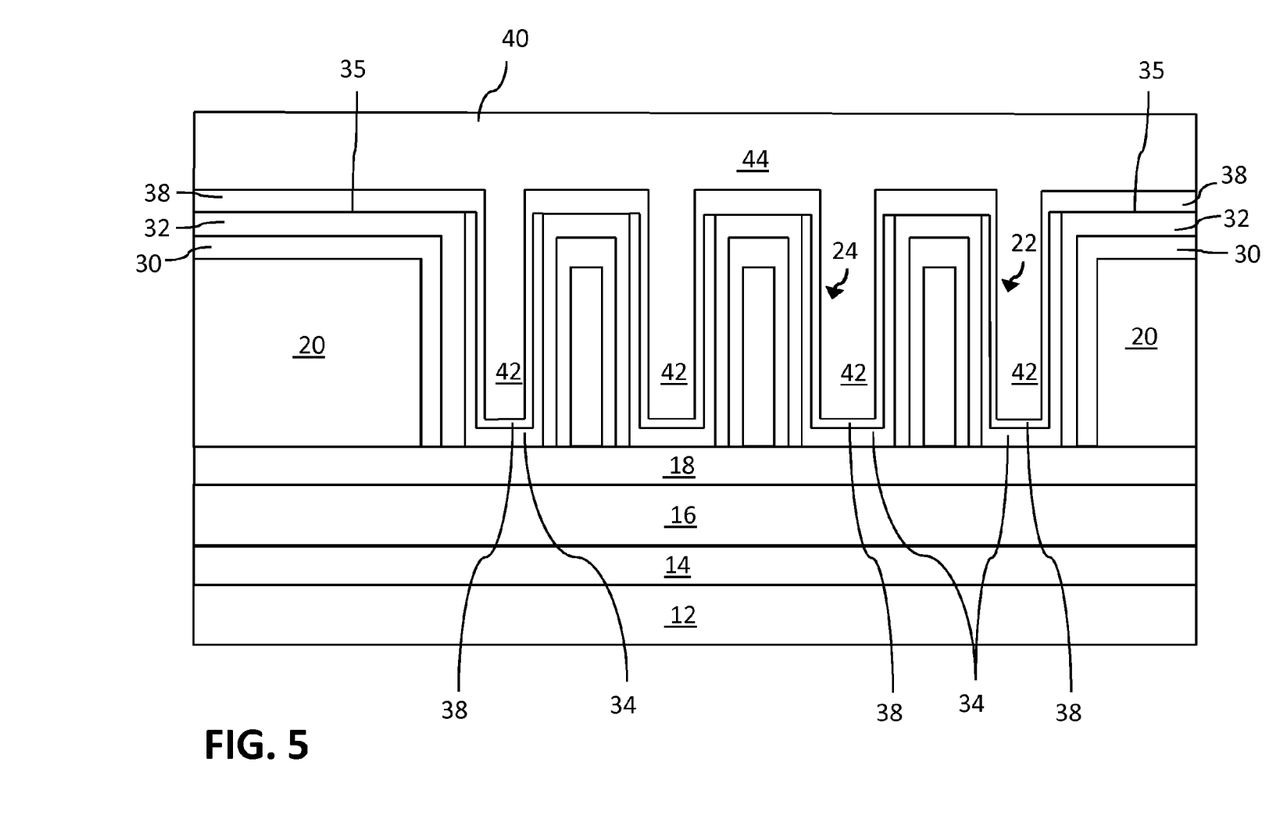

FIG. 5 depicts another process according to various embodiments of the invention, the process including forming a second node dielectric layer 38 covering node metal layer 34. More specifically, second node dielectric layer 38 may be formed over the exposed horizontal surface 35 of first node dielectric layer 32, as discussed above, and over node metal layer 34. As shown in FIG. 5, first node dielectric layer 32 and second node dielectric layer 38 may surround or insulate node metal layer 34 and may substantially isolate node metal layer 34 from doped semiconductor layer 30. Second node dielectric layer 38 may include any conventional dielectric material (e.g., oxide) and may be formed according to one or more of the various deposition techniques now known or later developed.

Figure 10:
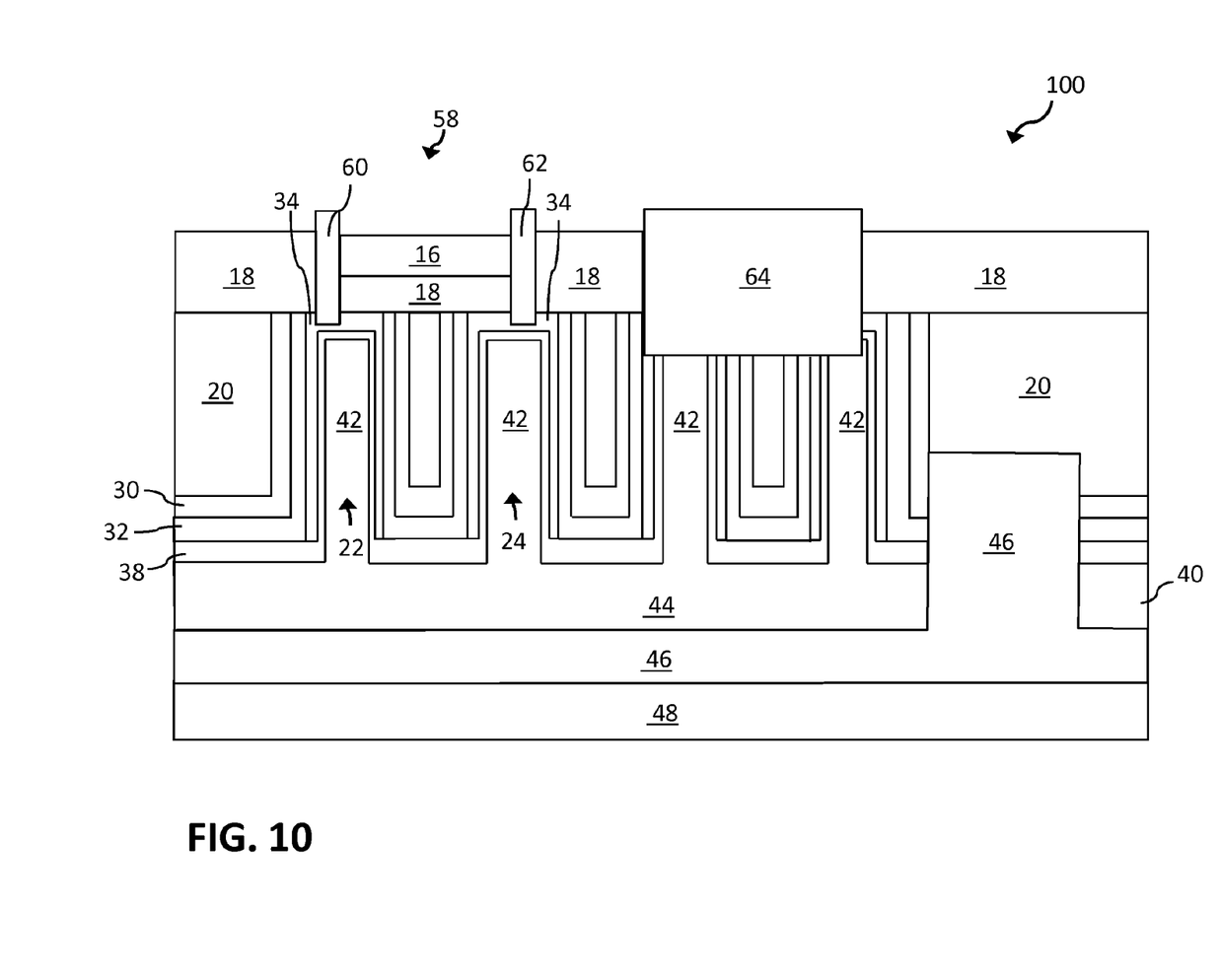
FIG. 10 depicts a cross-sectional view of a semiconductor-on-insulator (SOI) deep trench capacitor structure according to embodiments of the invention.

FIG. 5 also depicts another process according to various embodiments of the invention, the process including filling a remaining portion of each trench opening (e.g., first and second trench openings 22, 24) with a metal layer 40 to form an inner node 42 in each of first and second trench openings 22, 24. In an embodiment, as shown in FIG. 5, inner nodes 42 may be formed over second node dielectric layer 38, such that second node dielectric layer 38 may separate node metal layer 34 from inner nodes 42 of metal layer 40. With reference to FIGS. 3 and 4, node metal layer 34 may be formed as an outer node metal layer and metal layer 40 may be formed as an inner node metal layer. Metal layer 40 may also include a plate 44 coupling inner nodes 42 of each of first and second trench openings 22, 24. More specifically, after depositing inner nodes 42 of metal layer 40 within the trench openings (e.g., first and second trench openings 22, 24), plate 44 of metal layer 40 may be form by depositing a continuous material over inner nodes 42 and second node dielectric layer 38. Metal layer 40 may include, for example, titanium nitride (TiN), tungsten (W), or tungsten silicide ($WSi_2$), and may be formed according to one or more of the various deposition techniques now known or later developed. In an embodiment, metal layer 40 and node metal layer 34 may include the same material composition when forming a deep trench capacitor structure 100 (FIG. 10). In an alternative embodiment, metal layer 40 and node metal layer 34 may include distinct material composition when forming deep trench capacitor structure 100 (FIG. 10).

Figure 6:
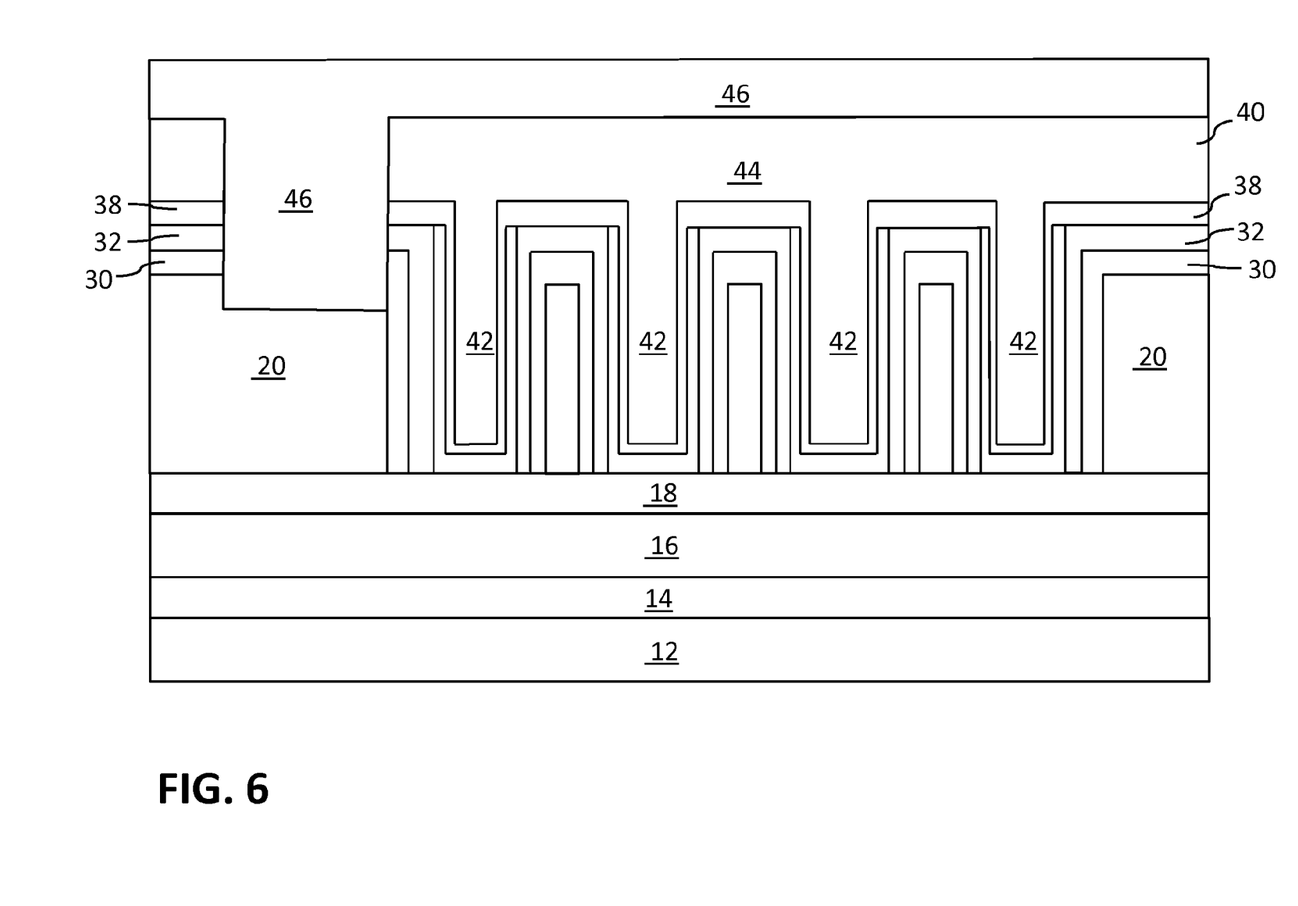

FIG. 6 depicts an additional process according to various embodiments of the invention, the process including forming an oxide layer 46 covering plate 44 of metal layer 40. More specifically, an etch (e.g., RIE) is made to remove a portion of plate 44 of metal layer 40, second node dielectric layer 38, first node dielectric layer 32, doped semiconductor layer 30 and a portion of semiconductor layer 20. Once the etching process is complete, oxide layer 46 may be formed over plate 44 of metal layer 40 and within the space created by the etching process. The process of etching and forming oxide layer 46 may be for isolating inner nodes 42 of metal layer 40. Oxide layer 46 may be formed according to one or more of the various deposition techniques now known or later developed.

Figure 7:
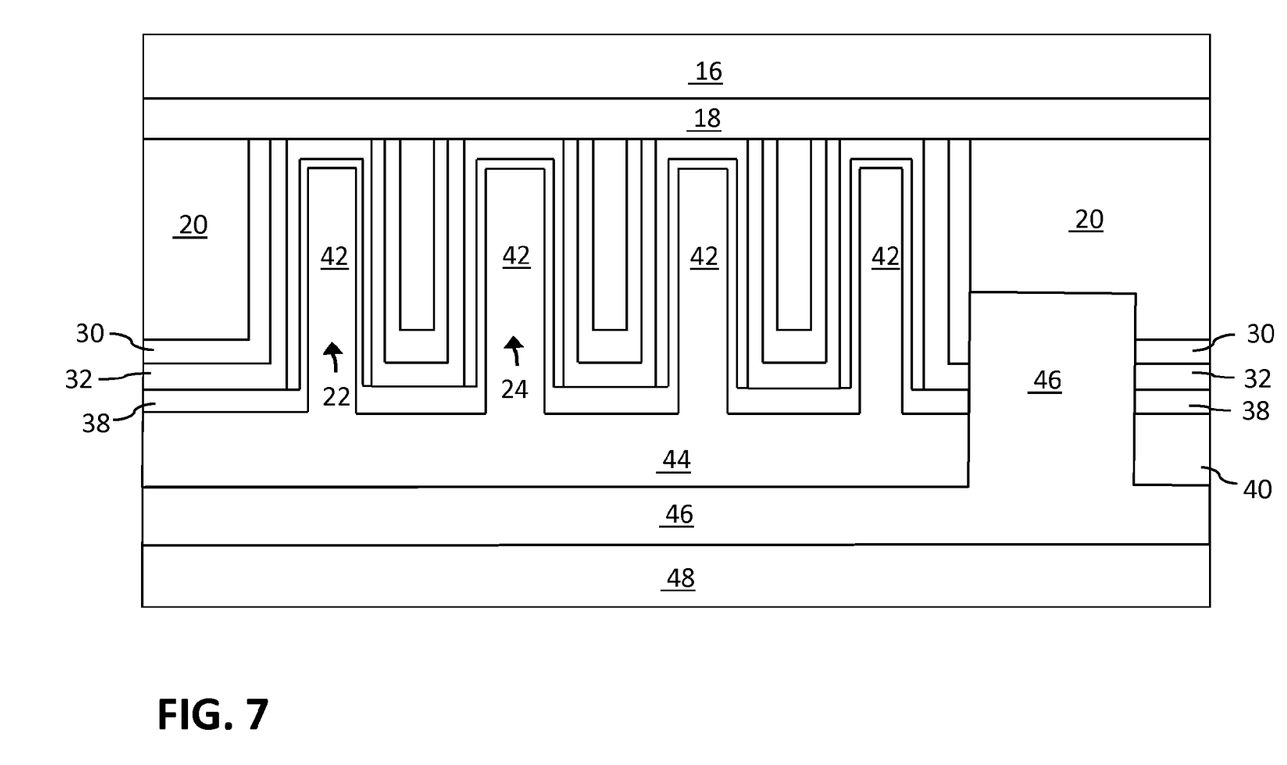

FIG. 7 depicts another process according to various embodiments of the invention, the process including flipping SOI structure 10. More specifically, and in comparison with FIGS. 6 and 7, SOI structure 10, and the additional layers (e.g., node metal layer 34, metal layer 40, etc.) may be flipped by 180 degrees, such that substantially U-shaped node 37 of metal layer 34 may now be shown as an inverted "U." In addition to flipping SOI structure 10, and the additional layers, oxide layer 46, now positioned at the bottom of the semiconductor structure, may be bonded to a second handle wafer 48. Oxide layer 46 may be bonded to second handle wafer 48 so processes of forming the deep trench capacitor structure may continue after the flipping process. Oxide layer 46 may be bonded to second handle wafer 48 by any now known or later developed wafer bonding process, e.g., direct bonding, reactive bonding, adhesive bonding, etc.

FIG. 7 also depicts an additional process according to various embodiments of the invention, the process including removing first handle wafer 12 and first dielectric layer 14 from SOI structure 10. First handle wafer 12 and first dielectric layer 14 may be removed from SOI structure by a planarization or etch process (e.g., chemical mechanical polish (CMP)), resulting in active layer 16 of SOI structure 10 being exposed.

Figure 8:
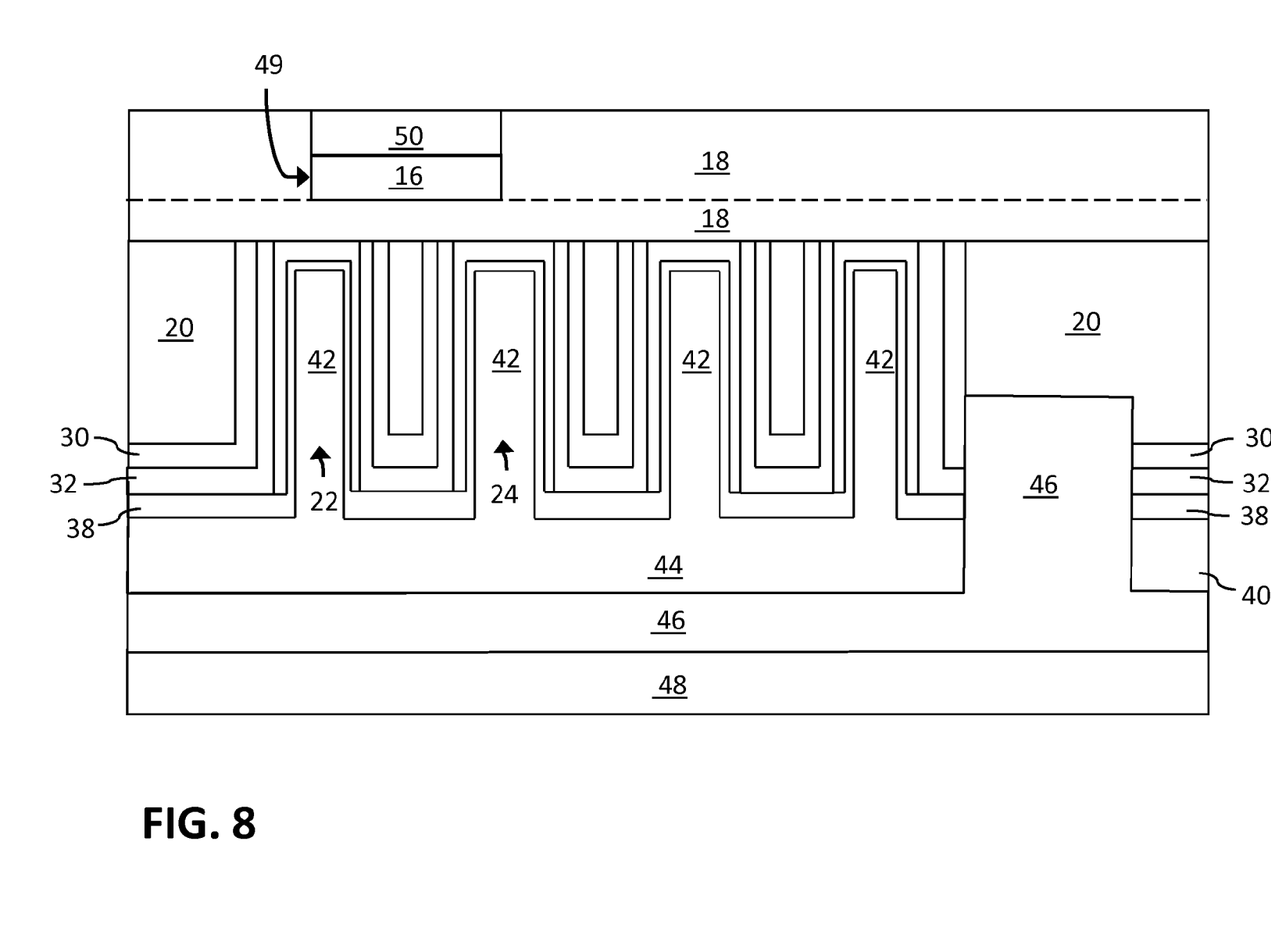

FIG. 8 depicts another process according to various embodiments of the invention, the process including etching a portion of exposed active layer 16 of SOI structure 10. More specifically, the majority of active layer 16 may be removed by any now known or later developed material removal process (e.g., pattern and etch process) such as that used to form a shallow trench isolation (STI). In this case, only a portion 49 of active layer 16 having a width substantially equal to the distance between the center of first and second trench openings 22, 24 may remain over second dielectric layer 18.

FIG. 8 also depicts an additional process according to various embodiments of the invention, the process including forming a silicon nitride ($Si_3N_4$) layer 50 over active layer 16 and adding dielectric material (e.g., oxide) to second dielectric layer 18. More specifically, silicon nitride layer 50 may be formed over the entire active layer 16 (FIG. 7) according to one or more of the various deposition techniques now known or later developed. After silicon nitride layer 50 is formed over active layer 16, both silicon nitride layer 50 and active layer 16 may be patterned and etched together to form a portion 49 of silicon nitride layer 50 and active layer 16, respectively. Once portion 49 of silicon nitride layer 50 and active layer 16 is formed, dielectric material may be added or filled in to second dielectric layer 18 according to one or more of the various deposition techniques now known or later developed. More specifically, second dielectric layer 18, illustrating the original surface in phantom, may be filled with additional dielectric (e.g., oxide), so second dielectric layer 18 may be substantially the same height or higher than silicon nitride layer 50 and will cover 50. FIG. 8 shows the structure after a planarization step that recesses the oxide layer 18 to be substantially the same height as layer 50. As a result of the planarization step, layer 50 may have become thinner in height then as previously deposited, as discussed above.

Figure 9:
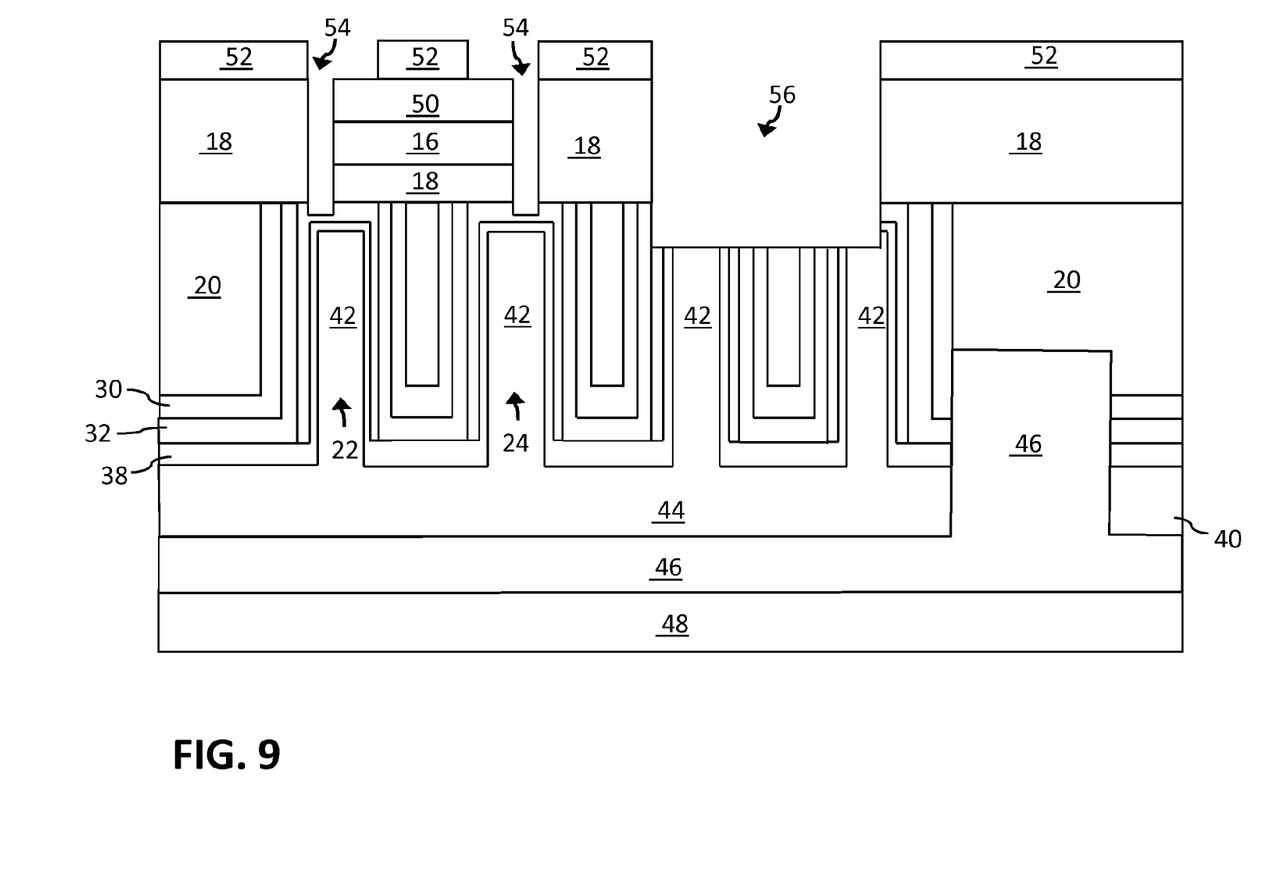

FIG. 9 depicts additional processes according to various embodiments of the invention, the processes including forming a photo resist layer 52 over second dielectric layer 18 and silicon nitride layer 50, and forming connection trenches 54, 56 in the semiconductor structure. More specifically, photo resist layer 52 may be formed over second dielectric layer 18 and silicon nitride layer 50, and two node connection trenches 54 and a plate connection trench 56 may be formed in the semiconductor structure. Photo resist layer 52 may be formed over second dielectric layer 18 and silicon nitride layer 50 according to one or more of the various deposition techniques now known or later developed. Two node connection trenches 54 may be formed on either side of active layer 16, through second dielectric layer 18 and a portion of node metal layer 34 by a pattern and etching process for removing material. More specifically, two node connection trenches 54 may expose a portion of node metal layer 34 in contact with bottom surface 28 of each of first and second trench openings 22, 24, respectively. Plate connection trench 56 may be formed in any additional trench openings formed in semiconductor layer 20 of SOI structure 10, exclusive of first and second trench openings 22, 24. That is, plate connection trench 56 may be formed through second dielectric layer 18, the layers of semiconductor structure that are included within trench openings (e.g., node metal layer 34, inner node 42 of metal layer 40, etc.), exclusive of first and second trench openings 22, 24, and the layers of semiconductor structure that define the trench openings (e.g., semiconductor layer 20, doped semiconductor layer 30, etc.). Plate connection trench 56 may be formed by any now known or later developed material removal technique, for example, a pattern and etching process, similarly used in forming node connection trenches 54. In an alternative embodiment, connection trenches 54, 56 may be formed using a conventional pattern and etching process.

FIG. 10 depicts additional processes according to various embodiments of the invention in forming deep trench capacitor structure 100. One such process shown in FIG. 10 includes forming a node connection structure 58 to conductively connect node metal layer 34 in first trench opening 22 with node metal layer 34 in second trench opening 24. More specifically, forming node connection structure 58 includes forming a first node connection 60 in node connection trench 54 exposing a portion of node metal layer 34 in first trench opening 22, and forming a second node connection 62 in node connection trench 54 exposing a portion of node metal layer 34 of second trench opening 24. First node connection 60 may be conductively connected to node metal layer 34 of first trench opening 22, and second node connection 62 may be conductively connected to node metal layer 34 of second trench opening 24. Additionally, as shown in FIG. 10, active layer 16 may be conductively connected to first node connection 60 and second node connection 62. First node connection 60 and second node connection 62 may include a silicon, and more specifically can include a doped polysilicon. In an embodiment, first node connection 60 and second node connection 62 may be doped with, for example, N-type dopants, as similarly discussed with respect to semiconductor layer 30. In an alternative embodiment, first node connection 60 and second node connection 62 may be doped with, for example, p-type dopants, which may include but are not limited to: boron (B), indium (In) and gallium (Ga). P-type indicates an element is introduced to first node connection 60 and second node connection 62 to generate free hole (by "accepting" electron from semiconductor atom and "releasing" hole at the same time); acceptor atom must have one valence electron less than host semiconductor; boron (B) is the most common acceptor in silicon technology; alternatives include indium and gallium (gallium features high diffusivity in SiO2, and hence, oxide cannot be used as mask during Ga diffusion).

FIG. 10 also depicts another process according to various embodiments of the invention, the process including forming a plate connection structure 64 to conductively connect semiconductor layer 20, doped semiconductor layer 30, metal layer 40 and node metal layer 34. More specifically, plate connection structure 64 may be formed within plate connection trench 56 to conductively connect the layers of deep trench capacitor structure 100, exclusive of the layers found in first and second trench openings 22, 24. Plate connection structure 64 may include a silicon, and more specifically, a doped polysilicon, similar to the first and second node connections 60, 62. Plate connection structure 64 may be formed according to one or more of the various deposition techniques now known or later developed.

FIG. 10 depicts an additional process according to various embodiments of the invention, the process including removing silicon nitride layer 50, and a portion of second dielectric layer 18. In an embodiment, silicon nitride layer 50 and a portion of second dielectric layer 18 may be removed according to one or more of the various material removal techniques now known or later developed, e.g., polishing, reactive ion etching, pattern and etching process, etc. As a result of removing a portion of second dielectric layer 18, first node connection 60, second node connection 62 and plate connection structure 64 may be have contact surfaces positioned substantially above a top surface of second dielectric layer 18.

In an embodiment, as shown in FIG. 10, deep trench capacitor structure 100 may include semiconductor-on-insulator (SOI) structure 10 (FIG. 1) including first trench opening 22 and second trench opening 24 in semiconductor layer 20 of SOI structure 10. SOI structure 10 may include, active layer 16, second dielectric layer 18 over active layer 16, and semiconductor layer 20 over second dielectric layer 18. Deep trench capacitor structure 100 may also include doped semiconductor layer 30 covering sidewalls 26 and exposing bottom surface 28 of each of first and second trench opening 22, 24. As shown in FIG. 10, deep trench capacitor structure 100 further includes first node dielectric 32 covering doped semiconductor layer 30 and node metal layer 34 over first node dielectric layer 32. As shown in FIG. 10, node metal layer 34 contacts bottom surface 28 (FIG. 1) of each of first and second trench openings 22, 24.

In an embodiment, as shown in FIG. 10, deep trench capacitor structure 100 may also include second node dielectric layer 38 covering node metal layer 34, and metal layer 40 disposed within a remaining portion of first and second trench openings 22, 24 to form inner node 42. Metal layer 40 may also include plate 44 coupling inner node 42 of each of the first and second trench openings 22, 24. Lastly, as shown in FIG. 10, deep trench capacitor structure 100 may include node connection structure 58 conductively connecting node metal layer 34 in first trench opening 22, with node metal layer 34 in second trench opening 24. In an embodiment, node connection structure 58 may include first node connection 60 conductively connected to node metal layer 34 of first trench opening 22, and second node connection 62 conductively connected to node metal layer 34 of second trench opening 24. Additionally, as shown in FIG. 10, node connection structure 58 may include active layer 16 conductively connected to first node connection 60 and second node connection 62.

Deep trench capacitor 100 and the method of forming deep trench capacitor 100, as discussed above, may provide distinct advantages to conventional deep trench capacitors and conventional forming techniques. In contrast to conventional deep trench capacitors, deep trench capacitor 100 may provide a higher quality layer bond of Semiconductor-on-insulator (SOI) before deep trenches are formed in the semiconductor layer. Additionally, in contrast to conventional deep trench capacitors, deep trench capacitor 100 may provide twice the dielectric or oxide capacitance for a deep trench capacitor (e.g., deep trench capacitor 100) and deep trenches of the deep trench capacitor discussed above may extend under the transistor. Further, in contrast to conventional deep trench capacitors which typically include two connection plates or contacts, deep trench capacitor 100 may provide twice the capacitance as a result of including three connection plates or contacts (e.g., first node connection 60, second node connection 62, plate connection structure 64). Finally, in contrast to conventional deep trench capacitors, deep trench capacitor 100 may have a lowered resistance of capacitor as a result of the arrangement and material used for the layers (e.g., active layer 16, node metal layer 34, metal layer 40, etc.) that form deep trench capacitor 100.

Figure 11:
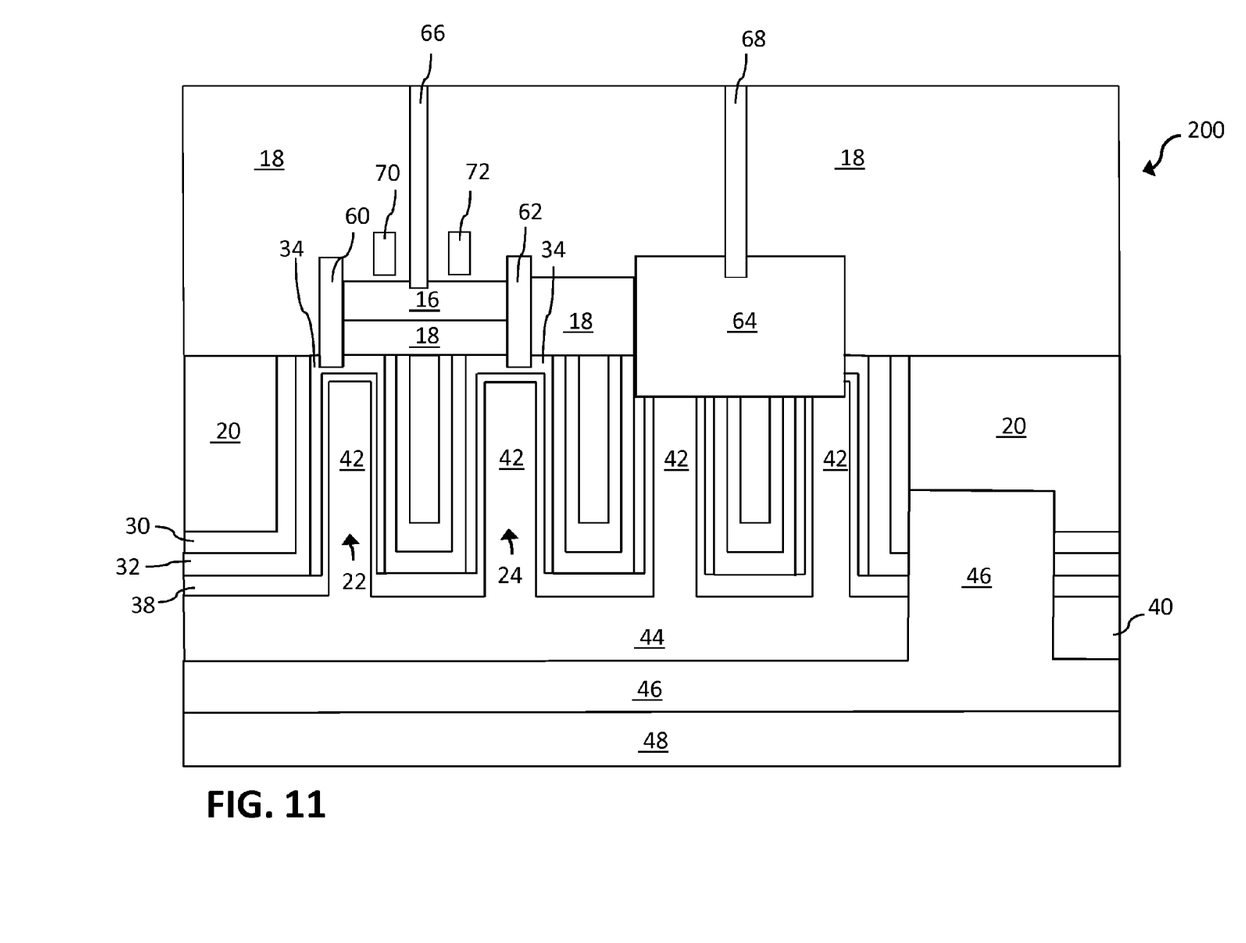
FIG. 11 depicts a cross-sectional view of an eDRAM array formed by a semiconductor-on-insulator (SOI) deep trench capacitor structure according to embodiments of the invention.
Figure 12:
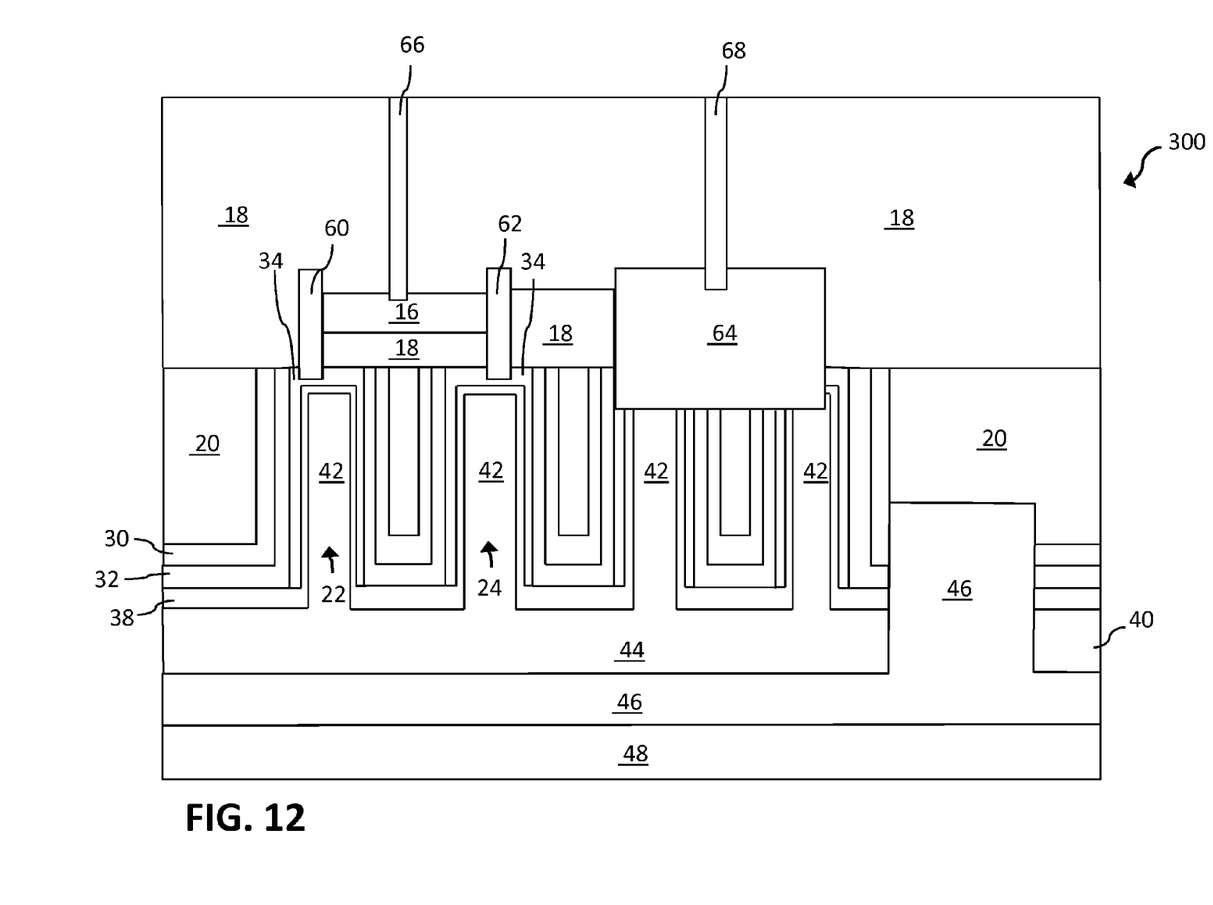
FIG. 12 depicts a cross-sectional view of a decoupling capacitor formed by a semiconductor-on-insulator (SOI) deep trench capacitor structure according to an alternative embodiment of the invention.
Figure 13:
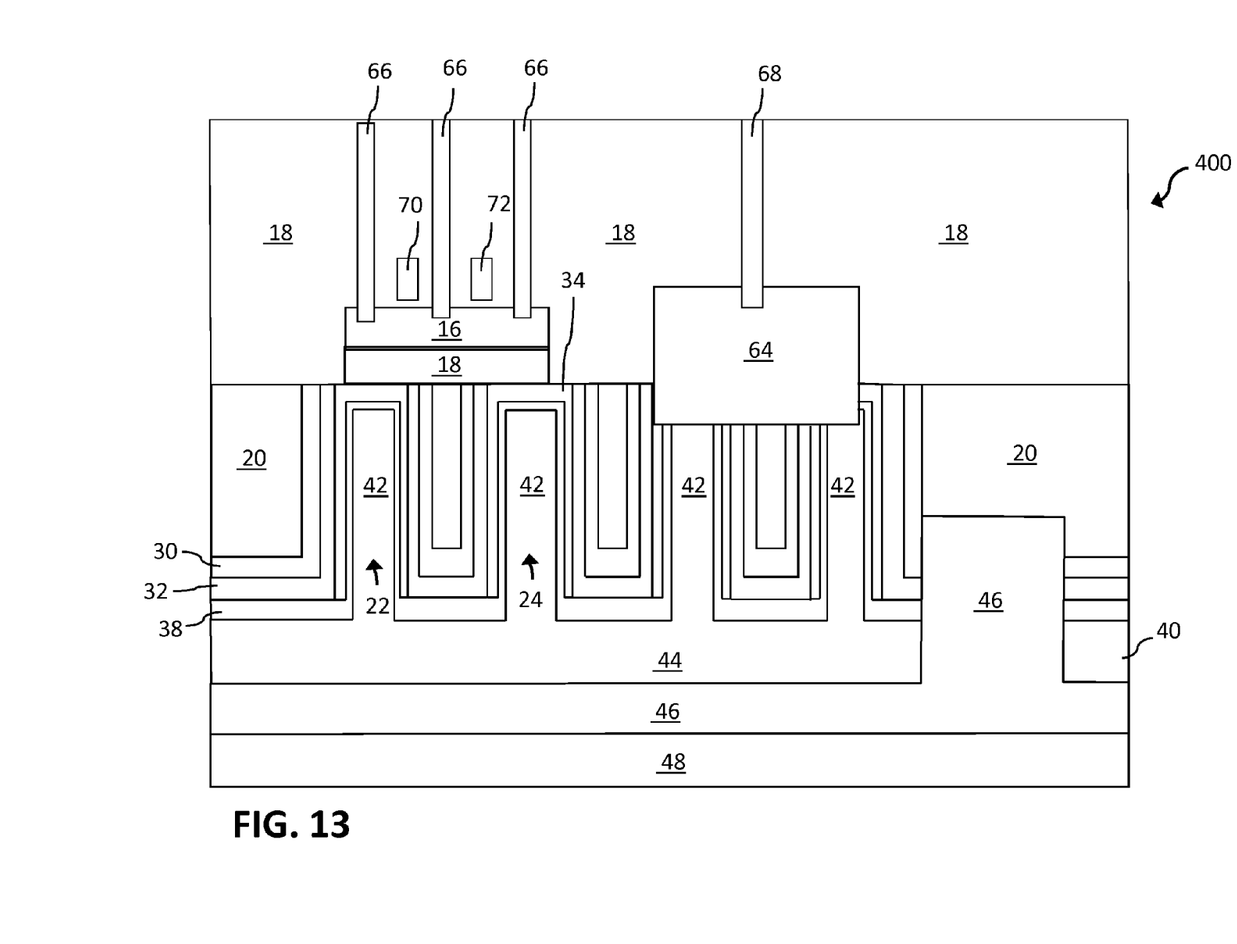
FIG. 13 depicts a cross-sectional view of a CMOS device formed by a semiconductor-on-insulator (SOI) deep trench capacitor structure according to an additional alternative embodiment of the invention.

It is understood that deep trench capacitor 100 and the method of forming deep trench capacitor 100, as shown and described with reference FIGS. 1-10, may be used to form a variety of transistors. For an example, in an embodiment, as shown in FIG. 11, an eDRAM array 200 may be formed from deep trench capacitor 100. More specifically, as shown in FIG. 11, eDRAM 200 may include deep trench capacitor 100, an active layer contact 66 in contact with active layer 16, and a plate contact 68 in contact with plate connection structure 64. Also shown in FIG. 11, eDRAM 200 may include a first and second gate 70, 72 on either side of active layer contact 66 for accessing either first or second trench openings 22, 24, dependent on whether first gate 70 or second gate 72 is activated. Active layer contact 66 and plate contact 68 and first and second gate 70, 72 may be formed by any conventional technique now know or later developed. In a further alternative embodiment, as shown in FIG. 12, deep trench capacitor 100 (FIG. 10) may be used to form an additional transistor. More specifically, as shown in FIG. 12, deep trench capacitor 100 may be used to form decoupling capacitor 300. With reference to FIG. 11, decoupling capacitor 300 may include active layer contact 66 and plate contact 68, and may not include first and second gate 70, 72. In an additional embodiment, as shown in FIG. 13, deep trench capacitor 100 may be used to form a CMOS device 400. As shown in FIG. 13, with reference to FIG. 11, CMOS device 400 may include three active layer contacts 66 and a first and second gate 70, 72 positioned between the three active layer contacts 66, respectively. As shown in FIG. 13, CMOS device 400 may also include plate contact 68. However, as shown in FIG. 13, CMOS device 400 may not include first and second node connection 60, 62 of deep trench capacitor 100.

It is understood that the variety of transistors (e.g., FIG. 11-13) formed using deep trench capacitor 100 may provide substantially similar functions as conventional transistor. However, as discussed above, the transistors formed from deep trench capacitor 100 may provide advantages over conventional transistors such as, but not limited to, higher quality layer bond of Semiconductor-on-insulator (SOI) before deep trenches are formed in the semiconductor layer, twice the capacitance and/or a lowered resistance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a deep trench capacitor structure, the method comprising:
   providing a semiconductor-on-insulator (SOI) structure including a first trench opening and a second trench opening in a semiconductor layer of the SOI structure;
   forming a doped semiconductor layer covering sidewalls and exposing a bottom surface of each of the first and the second trench openings;
   forming a first node dielectric layer covering the doped semiconductor layer;
   forming a node metal layer over the first node dielectric layer and contacting the bottom surface of each of the first and the second trench openings;
   forming a second node dielectric layer covering the node metal layer;
   filling a remaining portion of each trench opening with a metal layer to form an inner node in each of the first and the second trench openings, the metal layer including a plate coupling the inner node of each of the first and the second trench openings; and
   forming a node connection structure to conductively connect the node metal layer in the first trench opening with the node metal layer in the second trench opening.

2. The method of claim 1, wherein the node connection structure includes:
   a first node connection conductively connected to the node metal layer of the first trench opening;
   a second node connection conductively connected to the node metal layer of the second trench opening; and
   an active layer conductively connected to the first node connection and the second node connection.

3. The method of claim 2, wherein the first node connection and the second node connection include a doped polysilicon.

4. The method of claim 1, further comprising:
   forming a plate connection structure to conductively connect the semiconductor layer, the doped semiconductor layer, the metal layer and the node metal layer.

5. The method of claim 4, wherein the plate connection structure includes a doped polysilicon.

6. The method of claim 1, further comprising:
   forming an oxide layer covering the plate, a portion of the oxide layer extending through the plate of the metal layer, the doped semiconductor layer and a portion of the semiconductor layer of the SOI structure.

7. The method of claim 1, wherein the node metal layer forms a substantially U-shaped node within each of the first and the second trench openings.

8. A deep trench capacitor structure comprising:
   a semiconductor-on-insulator (SOI) structure including a first trench opening and a second trench opening in a semiconductor layer of the SOI structure;

a doped semiconductor layer covering sidewalls and exposing a bottom surface of each of the first and the second trench openings;
 a first node dielectric layer covering the doped semiconductor layer;
 a node metal layer over the first node dielectric layer, the node metal layer contacting the bottom surface of each of the first and the second trench openings;
 a second node dielectric layer covering the node metal layer;
 a metal layer disposed within a remaining portion of the first and the second trench openings to form an inner node, the metal layer including a plate coupling the inner node of each of the first and the second trench openings; and
 a node connection structure conductively connecting the node metal layer in the first trench opening with the node metal layer in the second trench opening.

9. The structure of claim 8, wherein the node connection structure includes:
 a first node connection conductively connected to the node metal layer of the first trench opening;
 a second node connection conductively connected to the node metal layer of the second trench opening; and
 an active layer conductively connected to the first node connection and the second node connection.

10. The structure of claim 9, wherein the first node connection and the second node connection include a doped polysilicon.

11. The structure of claim 8, further comprising:
 a plate connection structure conductively connecting the semiconductor layer, the doped semiconductor layer, the metal layer and the node metal layer.

12. The structure of claim 8, wherein the plate connection structure includes a doped polysilicon.

13. The structure of claim 8, further comprising:
 an oxide layer covering the plate, a portion of the oxide layer extending through the plate of the metal layer, the doped semiconductor layer and a portion of the semiconductor layer of the SOI structure.

14. The structure of claim 8, wherein the semiconductor layer includes a high resistance polysilicon.

15. The structure of claim 8, wherein the doped semiconductor layer includes a low resistance doped silicon.

16. The structure of claim 8, wherein the node metal layer forms a substantially U-shaped node within each of the first and the second trench openings.

17. The structure of claim 8, wherein the node metal layer includes one of titanium nitride (TiN), tungsten (W), or tungsten silicide (WSi$_2$).

18. The structure of claim 8, wherein the metal layer includes one of titanium nitride (TiN), tungsten (W), or tungsten silicide (WSi$_2$).

19. A method of forming a deep trench capacitor structure, the method comprising:
 providing a semiconductor-on-insulator (SOI) structure including a plurality of trench openings in a semiconductor layer of the SOI structure;
 forming a doped semiconductor layer covering sidewalls and exposing a bottom surface of each of the plurality of trench openings;
 forming a first node dielectric layer covering the doped semiconductor layer;
 forming an outer node metal layer over the first node dielectric layer and contacting the bottom surface of each of the plurality of trench openings;
 forming a second node dielectric layer covering the outer node metal layer;
 filling a remaining portion of each of the plurality of trench openings with an inner node metal layer, the inner node metal layer including a plate coupling the inner node metal layer filled in each of the plurality of trench openings; and
 forming a node connection structure to conductively connect the outer node metal layer in a first trench opening of the plurality of trench openings with the outer node metal layer in a second trench opening of the plurality of trench openings.

20. The method of claim 19, further comprising:
 forming a plate connection structure for conductively connecting the semiconductor layer, the doped semiconductor layer, the outer node metal layer and the inner node metal layer.

\* \* \* \* \*